US010374562B1

(12) United States Patent
Cloud et al.

(10) Patent No.: US 10,374,562 B1
(45) Date of Patent: Aug. 6, 2019

(54) PHANTOM-POWERED AUDIO PRE-PREAMPLIFIER WITH INTEGRATED TRANSFORMER FOR MUSICAL INSTRUMENT AND MICROPHONE DUAL-SELECTIVE SIGNAL GAIN

(71) Applicant: Cloud Microphones, LLC., Tucson, AZ (US)

(72) Inventors: Rodger Cloud, Tucson, AZ (US); Brad Sconzert, Tucson, AZ (US)

(73) Assignee: Cloud Microphones, LLC., Tucson, AZ (US)

( * ) Notice: Subject to any disclaimer, the term of this patent is extended or adjusted under 35 U.S.C. 154(b) by 34 days.

(21) Appl. No.: 15/630,928

(22) Filed: Jun. 22, 2017

Related U.S. Application Data

(63) Continuation-in-part of application No. 15/090,467, filed on Apr. 4, 2016, now Pat. No. 9,948,257, which
(Continued)

(51) Int. Cl.
*H03G 3/10* (2006.01)
*H03F 3/181* (2006.01)
(Continued)

(52) U.S. Cl.
CPC ............. *H03G 3/10* (2013.01); *G06F 3/162* (2013.01); *H03F 3/181* (2013.01); *H04R 3/007* (2013.01); *H04R 3/04* (2013.01); *H03F 2200/03* (2013.01)

(58) Field of Classification Search
CPC . H04R 3/007; H04R 3/04; H03G 3/10; H03G 3/00; H03F 3/181; H03F 2200/03
(Continued)

(56) References Cited

U.S. PATENT DOCUMENTS 5,710,821 A * 1/1998 Cheah ............... G06F 1/181
181/156
6,266,423 B1 * 7/2001 Werrbach ............ H03G 1/0064
381/106

(Continued)

*Primary Examiner* — Disler Paul
(74) *Attorney, Agent, or Firm* — Invent Capture, LLC.; Samuel S. Cho

(57) ABSTRACT

A novel phantom-powered inline preamplifier is configured to provide selective processing of a sound source signal by intelligently determining the need for a low or high impedance matching and transformer coupling, based on high fidelity requirements of a particular sound source signal. For example, the phantom-powered inline preamplifier can intelligently detect a microphone-originating sound source signal and automatically route the microphone-originating sound source signal to a low impedance matching circuit pathway that leads to a phantom-powered output terminal for an optimal hi-fidelity processing specific to the microphone-originating sound source signal. Likewise, the phantom-powered inline preamplifier can intelligently detect a musical instrument-originating sound source signal and automatically route the musical instrument-originating sound source signal to a high impedance matching circuit pathway and optionally couple to an instrument transformer, which leads to the phantom-powered output terminal for an optimal hi-fidelity processing specific to the musical instrument-originating sound source signal.

18 Claims, 8 Drawing Sheets

Related U.S. Application Data is a continuation of application No. 13/655,840, filed on Oct. 19, 2012, now Pat. No. 9,306,519, application No. 15/630,928, which is a continuation-in-part of application No. 14/961,632, filed on Dec. 7, 2015, now Pat. No. 9,813,791, which is a continuation of application No. 14/158,863, filed on Jan. 19, 2014, now Pat. No. 9,210,508.

(60) Provisional application No. 61/549,048, filed on Oct. 19, 2011.

(51) Int. Cl.
*H04R 3/00*     (2006.01)
*G06F 3/16*     (2006.01)
*H04R 3/04*     (2006.01)

(58) Field of Classification Search
USPC .................................................. 381/120, 118
See application file for complete search history.

(56) References Cited

U.S. PATENT DOCUMENTS

| | | | |
|---|---|---|---|
| 8,081,777 B2* | 12/2011 | North | H03F 1/0211 330/127 |
| 2011/0182442 A1* | 7/2011 | McDonald | H04H 60/04 381/109 |
| 2017/0347195 A1* | 11/2017 | de Vries | H03F 1/3211 |

* cited by examiner

100B

200B

300B

400

PHANTOM-POWERED AUDIO PRE-PREAMPLIFIER WITH INTEGRATED TRANSFORMER FOR MUSICAL INSTRUMENT AND MICROPHONE DUAL-SELECTIVE SIGNAL GAIN

INCORPORATION BY REFERENCE

A US non-provisional patent application U.S. Ser. No. 15/090,467, titled "Phantom-Powered Inline Preamplifier with Variable Impedance Loading and Adjustable Interface" and filed on Apr. 4, 2016, is incorporated herein by reference. The present invention is a continuation-in-part application of U.S. Ser. No. 15/090,467, which claims benefit to U.S. Ser. No. 13/655,840 with the earlier priority filing date of Oct. 19, 2012, which in turn claims benefit to U.S. 61/549,048 with the earlier priority filing date of Oct. 19, 2011.

Furthermore, a US non-provisional patent application U.S. Ser. No. 14/961,632, titled "Active Phantom-Powered Ribbon Microphone with Switchable Proximity Effect Response Filtering for Voice and Music Applications" and filed on Dec. 7, 2015, is incorporated herein by reference. The present invention is also a continuation-in-part application of U.S. Ser. No. 14/961,632, which claims benefit to U.S. Ser. No. 14/158,863 with the earlier priority filing date of Jan. 19, 2014.

BACKGROUND OF THE INVENTION

Audio preamplifiers are important components in sound recording, reproduction, or audio for live concerts or events. In general, an audio preamplifier takes an electrical signal generated from a microphone, a musical instrument, or another sound source as an input, and further processes and amplifies this input signal to generate a desirable level of amplified electrical signal to other components such as main amplifiers, speakers, or recording equipment Preamplifiers take an important role in determining amplified and/or reproduced sound characteristics of the sound source, because it is generally the first actively-powered stage for the electrical signal generated from the microphone or another sound source, which are highly vulnerable to undesirable distortions or noise introduced during any amplification stages. For example, an undesirable introduction of distortions or noise at or before the preamplifier stage may be magnified by subsequent amplification stages, thereby making post-preamplifier stage correction difficult and exacerbating any problems from the preamplifier to recording equipment or a listener.

Therefore, a novel first-stage preamplifier design (i.e. interchangeably called herein as a "pre-preamplifier") that provides a high-fidelity first-stage gain (i.e. a first-stage "lift" in signal from the sound source) to reduce the need of a larger single-stage jump in a subsequent amplification stage may be highly advantageous in minimizing undesirable noise and distortion for multi-stage amplification of audio recording or live performance.

Moreover, a novel preamplifier design that can intelligently and selectively provide signal gain and/or processing to a microphone-originating sound signal source and a musical instrument-originating sound signal source for the first-stage amplification while automatically selecting an appropriate high impedance, low impedance, and/or transformer-coupled signal pathway, depending on the nature of a sound signal source (e.g. microphone-originating, instrument-originating, etc.), may be highly advantageous to a user in an audio recording or live performance environment, because the user can utilize the same novel first-stage preamplifier box to handle various types of sound signal sources without needing to change or swap preamplifier equipment.

Furthermore, in the audio equipment industry, impedance matching or bridging between a sound signal source (e.g. a microphone, a musical instrument, etc.) and a preamplifier has been an important requirement for high fidelity electrical signal transmission between an output from the sound signal source and an input to the preamplifier. Conventional methods of impedance matching or bridging between the sound signal source and the preamplifier include using a commonly-used impedance value at the output of the sound signal source and the input of the preamplifier. A less used but another conventional method of impedance matching or bridging between the sound signal source and the preamplifier is varying the output impedance value of a sound signal source by adjusting the sound signal source's passive circuitry before the output of the sound signal source is transmitted to any active power elements or a preamplifier.

These conventional methods of impedance matching or bridging are typically only used for efficient signal transmission between the sound signal source and the preamplifier, and are not designed to produce customized effects for various sound characteristics at a preamplifier stage. Because the preamplifier is generally the first stage for active circuit processing of a sound source signal, certain customized effects for sound characteristics (e.g. an emphasis on a mid-range audible frequency, an emphasis on treble or bass, or other intended sound effects) may be best obtained at the preamplifier stage without causing significant amount of undesirable noise or distortion to the sound source signal.

Therefore, it may be advantageous to provide a preamplifier unit that can vary impedance loading conditions to obtain customized, desired, and/or adjustable sound characteristics at the preamplifier stage. It may be also beneficial to provide various embodiments of preamplifiers with different impedance loading adjustment interfaces.

SUMMARY

Summary and Abstract summarize some aspects of the present invention. Simplifications or omissions may have been made to avoid obscuring the purpose of the Summary or the Abstract. These simplifications or omissions are not intended to limit the scope of the present invention.

In one embodiment of the invention, a novel phantom-powered audio preamplifier is disclosed. This phantom-powered audio preamplifier comprises: an instrument and microphone combo jack configured to receive at least one of microphone-originating sound source signal and a musical instrument-originating sound source signal; a phantom-powered preamplifier gain circuit comprising one or more transistors to amplify at least one of the microphone-originating sound source signal and the musical instrument-originating sound source signal; an integrated instrument transformer coupled to the instrument and microphone combo jack and the phantom-powered preamplifier gain circuit to provide a high-impedance instrument signal gain and processing pathway for the musical instrument-originating sound source signal; and a phantom-powered singular output terminal configured to load phantom power and to simultaneously transmit an amplified signal derived from at least one of the microphone-originating sound source signal and the musical instrument-originating sound source signal through a singular output terminal that transmits both types of sound source signals.

Furthermore, in another embodiment of the invention, another novel phantom-powered audio preamplifier is disclosed. This phantom-powered audio preamplifier comprises: a dedicated low impedance microphone input jack configured to receive a microphone-originating sound source signal; a dedicated high impedance instrument input jack configured to receive a musical instrument-originating sound source signal; a phantom-powered preamplifier gain circuit comprising one or more transistors to amplify at least one of the microphone-originating sound source signal and the musical instrument-originating sound source signal; an integrated instrument transformer coupled to the dedicated high impedance instrument input jack and the phantom-powered preamplifier gain circuit to provide a high-impedance instrument signal gain and processing pathway for the musical instrument-originating sound source signal; and a phantom-powered singular output terminal configured to load phantom power and to simultaneously transmit an amplified signal derived from at least one of the microphone-originating sound source signal and the musical instrument-originating sound source signal through a singular output terminal that transmits both types of sound source signals.

BRIEF DESCRIPTION OF DRAWINGS

Implementations of the invention will become more apparent from the detailed description set forth below when taken in conjunction with the drawings, in which like elements bear like reference numerals.

DETAILED DESCRIPTION

Figure 1A:
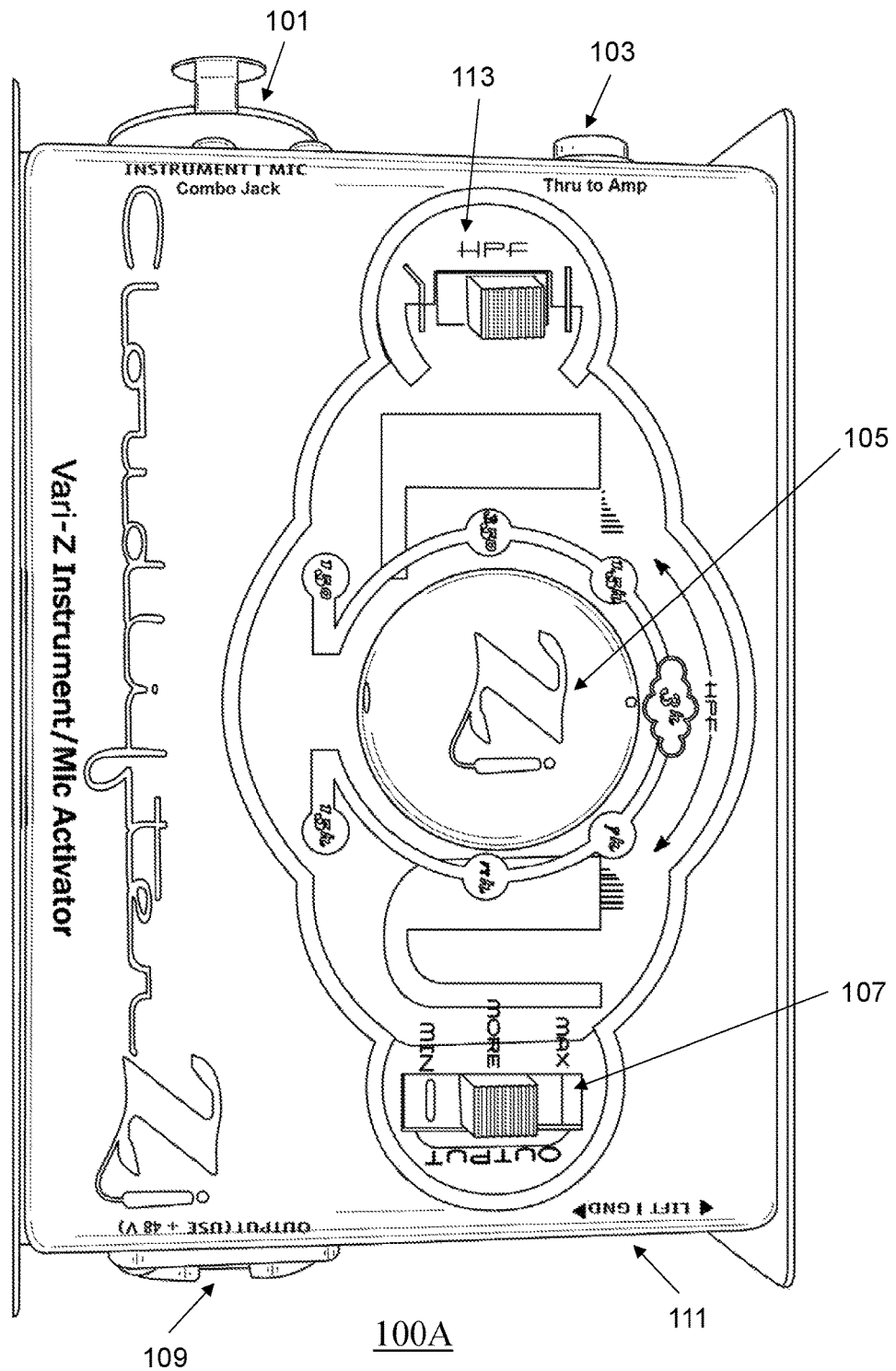
FIG. 1A shows a top view of a phantom-powered audio preamplifier with an integrated transformer, an instrument/microphone combo input jack, and a phantom-powered singular output, wherein the phantom-powered audio preamplifier intelligently and selectively processes musical instrument and microphone sound source signals, in accordance with an embodiment of the invention.

Specific embodiments of the invention will now be described in detail with reference to the accompanying figures. Like elements in the various figures are denoted by like reference numerals for consistency.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

The detailed description is presented largely in terms of description of shapes, configurations, and/or other symbolic representations that directly or indirectly resemble a phantom-powered audio preamplifier with an integrated transformer, one or more instrument/microphone input jacks, and a phantom-powered singular output, wherein the phantom-powered audio preamplifier intelligently and selectively processes musical instrument and microphone sound source signals. These process descriptions and representations are the means used by those experienced or skilled in the art to most effectively convey the substance of their work to others skilled in the art.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment. Furthermore, separate or alternative embodiments are not necessarily mutually exclusive of other embodiments. Moreover, the order of blocks in process flowcharts or diagrams representing one or more embodiments of the invention do not inherently indicate any particular order nor imply any limitations in the invention.

In general, embodiments of the invention relate to an audio preamplifier. More specifically, an embodiment of the invention relates to a phantom-powered audio preamplifier with an integrated transformer, one or more instrument/microphone dedicated or combo input jacks, and a phantom-powered singular output, wherein the phantom-powered audio preamplifier intelligently and selectively processes musical instrument and microphone sound source signals, in accordance with an embodiment of the invention.

Another embodiment of the invention relates to a phantom-powered audio preamplifier with an integrated transformer, a variable impedance loading adjustment interface, a high-pass filter adjustment interface, a variable-gain adjustment interface, one or more instrument/microphone dedicated or combo input jacks, and a phantom-powered singular output, wherein the phantom-powered audio preamplifier intelligently and selectively processes musical instrument and microphone sound source signals, in accordance with an embodiment of the invention.

Furthermore, one objective of an embodiment of the invention is to provide a phantom-powered inline preamplifier box which receives an electrical signal from a sound source such as a microphone or a musical instrument, wherein the phantom-powered inline preamplifier box provides selective processing of the sound source signal by intelligently determining the need for low or high impedance matching and transformer coupling based on the high fidelity requirements of a particular sound source signal. For example, when a combo input jack is utilized, the phantom-powered inline preamplifier can intelligently detect a microphone-originating sound source signal and automatically route the microphone-originating sound source signal to a low impedance matching circuit pathway for an optimal hi-fidelity processing specific to the microphone-originating sound source signal. Likewise, when a combo input jack is utilized, the phantom-powered inline preamplifier can intelligently detect a musical instrument-originating sound source signal and automatically route the musical instrument-originating sound source signal to a high impedance matching circuit pathway and optionally couple to an instrument transformer for an optimal hi-fidelity processing specific to the musical instrument-originating sound source signal.

Furthermore, another objective of an embodiment of the invention is providing at least one of a variable impedance loading adjustment interface, a high-pass filter adjustment interface, and a variable-gain adjustment interface that are integrated into a phantom-powered inline preamplifier box to enable production of highly-customizable sound characteristics from an earliest amplification stage (e.g. a "pre-preamplifier" stage, a first-stage amplification, etc.) connected to a sound source, which in turn minimizes undesirable noise and distortion while maximizing the user's intended sound effects for a particular recording or live performance application.

For the purpose of describing the invention, a "pre-preamplifier" is defined as an earliest-stage or firsts-stage signal gain apparatus, which is first-in-line for processing and amplifying a sound source signal. The pre-preamplifier may be a standalone apparatus or an integrated module that is incorporated into a microphone or a musical instrument output interface. The pre-preamplifier is intended to be a novel, optional, and/or unconventional apparatus that provides a high-fidelity signal lift before a conventional preamplifier provides additional gain in signal amplification.

Preferably, a phantom-powered inline preamplifier in one or more embodiments of the invention is a standalone pre-preamplifier unit responsible for processing and amplifying the sound source signal as a first-in-line signal amplification and processing apparatus. Alternatively, the phantom-powered inline preamplifier in accordance with an alternate embodiment of the invention is an integrated pre-preamplifier module incorporated in a microphone or in a musical instrument interface, wherein the integrated pre-preamplifier module is responsible for processing and amplifying the sound source signal as a first-in-line signal amplification and processing apparatus.

In addition, for the purpose of describing the invention, a "combo jack" or a "combo input jack" is defined as a combinatory dual input signal jack configured to dock with both a microphone jack plug and a musical instrument jack plug. In one example, the combo jack is configured to dock with both a low-impedance XLR microphone jack plug and a high-impedance ¼ (quarter) inch musical instrument jack plug.

Furthermore, for the purpose of describing the invention, "variable impedance loading" is defined as varying input impedance or internal impedance of a phantom-powered inline preamplifier for electrical signals received from a sound signal source, such as a microphone or a musical instrument. In general, the variable impedance loading is related to resistive impedance-based variable loading effects, wherein one or more resistors and/or a potentiometer operatively connected to an adjustable interface (e.g. a knob, a slider, a roller, a switch, and etc.) change resistive input impedance of the phantom-powered inline preamplifier.

FIG. 1A shows a top view (100A) of a phantom-powered audio preamplifier with an integrated transformer for a musical instrument-sourced signal, an instrument/microphone combo input jack (101), and a phantom-powered singular output (109). In this embodiment of the invention, the phantom-powered audio preamplifier also incorporates a thru-to-amp output jack (103), a variable impedance loading adjustment interface (105), a variable gain adjustment interface (107), a ground/lift adjustment interface (111), and a high-pass filter adjustment interface (113). The phantom-powered audio preamplifier in this embodiment of the invention can intelligently and selectively process musical instrument and microphone sound source signals in distinct signal processing pathways.

For example, the phantom-powered audio preamplifier receives a microphone-originating sound source signal through the instrument/microphone combo input jack (101), and the phantom-powered audio preamplifier is able to determine that the incoming signal is the microphone-originating sound source signal. This signal is then routed to a low-impedance (i.e. low Z) signal pathway that provides an early-stage signal gain to the microphone-originating sound source signal. In most circumstances, the microphone-originating sound source signal is optimally matched for high-fidelity early-stage signal amplification in the low-impedance signal pathway that involves an early-stage preamplifier gains circuit, and a high-impedance signal processing pathway that involves the integrated transformer suited for musical instruments is typically bypassed.

In a preferred embodiment of the invention, the microphone-originating sound source signal is carried into the phantom-powered audio preamplifier by a standardized XLR microphone jack plug that can be docked into the instrument/microphone combo input jack (101). In another embodiment of the invention, the microphone-originating sound source signal may be carried into the phantom-powered audio preamplifier by a proprietary microphone jack plug or another sound signal input jack plug.

Continuing with the embodiment of the invention as shown in FIG. 1A, the phantom-powered audio preamplifier is also configured to receive a musical instrument-originating sound source signal via the instrument/microphone combo input jack (101), and the phantom-powered audio preamplifier is able to determine that the incoming signal is the musical instrument-originating sound source signal, instead of the microphone-originating sound source signal. This signal is subsequently routed to a high-impedance (i.e. high Z) signal pathway that provides an early-stage signal gain to the musical instrument-originating sound source signal. In most circumstances, the musical instrument-originating sound source signal is optimally matched for high-fidelity early-stage signal amplification in the high-impedance signal pathway that further involves coupling the integrated transformer and an early-stage preamplifier gains circuit. In one example, the output from the integrated instrument transformer is coupled to the early-stage preamplifier gains circuit and also to the variable impedance loading adjustment interface (105), which provides the musical instrument a wide range of tonal options to a musical recording or live performance environment at the earliest signal amplification stage.

In the preferred embodiment of the invention, the musical instrument-originating sound source signal is carried into the phantom-powered audio preamplifier by a standardized 1/4-inch input jack plug that can be docked into the instrument/microphone combo input jack (101). In another embodiment of the invention, the musical instrument-originating sound source signal may be carried into the phantom integrated transformer by a proprietary musical instrument jack plug or another sound signal input jack plug. Furthermore, the integrated transformer incorporated into the phantom-powered audio preamplifier may be a Cinemag instrument transformer or another transformer device suitable for processing musical instrument-originating sound source signals.

The phantom-powered audio preamplifier, as shown in FIG. 1A, also incorporates the thru-to-amp output jack (103), which is configured to transmit an unaltered and unamplified high impedance signal originating from a musical instrument to an external amplifier, a pedal board, or a monitor. The unaltered high impedance signal initially inputted via the instrument/microphone combo input jack (101) and subsequently relayed to an external device via the thru-to-amp output jack (103) does not undergo signal amplification or impedance loading within the phantom-powered audio preamplifier itself, and does not suffer from undesirable loading effects commonly exhibited by conventional preamplifiers when and where a musical instrument-originating sound source signal is split. Therefore, the tone and the intensity of the sound outputted by the thru-to-amp output jack (103) is nearly identical to those directly captured from the musical instrument.

Moreover, as shown in FIG. 1A, the variable impedance loading adjustment interface (105) on a surface of the phantom-powered audio preamplifier enables the user to select a desired impedance value among a plurality of variable impedance settings (e.g. 150 ohms, 350 ohms, 1.5 k-ohms, 3 k-ohms, 7 k-ohms, 11 k-ohms, 15 k-ohms, etc.) to achieve a customizable tone from an incoming sound source signal from a microphone or a musical instrument. In the preferred embodiment of the invention, the variable impedance loading adjustment interface (105) incorporates a plurality of defined impedance adjustment settings that can be selected by a control knob, as shown in FIG. 1A. In another embodiment, the variable impedance loading adjustment interface (105) may instead incorporate a sweepable (i.e. continuously variable) knob, a slider, or another impedance adjustment mechanism to provide a continuously-variable impedance sweeping adjustment interface.

In the preferred embodiment of the invention, setting the phantom-powered inline audio preamplifier to a low impedance loading value may emphasize mid-range audible frequency of sound over treble and/or bass, which may be desired for certain musical instruments or recording environment. For example, classical music recordings or performances, which may benefit by emphasizing mid-range audible frequency, can utilize a lower impedance loading value setting (e.g. 1.5 k ohms) for optimal sound recording or live concert production environment. The optimal value will vary depending on the output impedance of a sound signal source. In general, with a higher impedance output, the optimal value may be higher. By varying impedance loading value settings, the resulting loading effects enable a user to customize and fine-tune desirable sound characteristics through the phantom-powered inline audio preamplifier.

On the other hand, setting the phantom-powered inline audio preamplifier to a high impedance loading value may increase frequency response over a broader audible frequency ranges, thereby giving an effect of stronger bass and treble in sound recording or live concert production environment. Therefore, a rock, pop, or jazz concert or recording may benefit from adjusting the impedance loading value of the phantom-powered inline preamplifier to a high impedance loading value setting (e.g. 3,000 ohms, 5,000 ohms, or higher). For example, a microphone with a 1000-ohm output impedance may sound more natural at around 10 k-ohms. In another example, a microphone with a lower impedance like 50 or 150 ohms may sound elevated in the bass and slightly more aggressive in the top.

Impedance loading values which fall outside the range of commonly-used impedance values may produce interesting sound characteristics. For example, a very low impedance loading value may deemphasize bass and/or treble too much to produce desirable sound effects in many cases. Loading with a very low impedance may deemphasize the bass and/or treble, producing a sound with a forward midrange. However, this could be desirable in the case of an electric guitar or other source where a high amount of mid-range focus is desired. Furthermore, a very high impedance loading value may emphasize more bass and/or treble too much to make resulting sound overly bright or harsh. However, in some applications, a user may want this sound effect to produce full and crisp sound. The advantage of various embodiments of the present invention is enabling a user to set his/her own preferred impedance loading value from the phantom-powered inline audio preamplifier unit, depending on a particular sound production/recording environment, output impedance characteristics of the microphone, and a particular source of sound (e.g. vocal, piano, bass drum, violin, guitar, and etc.).

Phantom-powered inline audio preamplifiers generally utilize another preamplifier operatively connected to the phantom-powered inline audio preamplifier, wherein the other preamplifier provides phantom power (e.g. 48 V). With the phantom-powered inline preamplifier providing a first-stage signal amplification, the secondary preamplifier may only need to produce a smaller amount of additional amplification (e.g. 10-20 dB), because the inline audio preamplifier is providing some good amount of gain (e.g. 20 dB) at the earliest amplification stage. Phantom-powered inline audio preamplifiers may be highly useful in enabling the secondary preamplifier and/or other mixer interfaces to operate in their "sweetspot" gain ranges. For example, many secondary preamplifiers provide high-fidelity and optimal amplification when providing 20 dB of gain, but significantly deteriorate past 30-40 dB of gain.

In addition, the variable gain adjustment interface (107) on the surface of the phantom-powered audio preamplifier enables the user to adjust a signal output gain setting in various strengths, such as "min," "more," and "max," as shown in FIG. 1A. In a preferred embodiment of the invention, the "min" mode may add approximately 6 dB of Class A discrete gain, while the "more" mode and the "max" mode add approximately 12 dB and 25 dB of Class A discrete gain, respectively. The variable gain adjustment interface (107) enables the phantom-powered audio preamplifier as disclosed in various embodiments of the present invention to accommodate a wide variety of sound signal sources ranging from low signal output sources, such as acoustic and piezo pickups, to higher signal output sources, such as humbucking pickups or keyboards, for the first-stage preamplification.

In the preferred embodiment of the invention, the variable gain adjustment interface (107) incorporates a plurality of defined impedance adjustment settings that can be selected by a multi-position switch, as shown in FIG. 1A. In another embodiment, the variable gain adjustment interface (107) may instead incorporate a sweepable (i.e. continuously variable) knob, a slider, or another variable gain adjustment mechanism to provide a continuously-variable sweeping adjustment interface.

Furthermore, the high-pass filter adjustment interface (113) on the surface of the phantom-powered audio preamplifier enables the user to adjust the impedance load further to reduce bass frequency range (e.g. 40 Hz~200 Hz) if the user desires bass frequency range reduction for the first-stage preamplification of an incoming sound source signal. In one example, the reduction of bass may be approximately 6 dB per octave when the high-pass filter mode is active. In the preferred embodiment of the invention, the high-pass filter adjustment interface (113) incorporates a plurality of defined high-pass filter adjustment settings that can be selected by a multi-position switch for a full-frequency mode (i.e. no high-pass filtering) or a bass frequency reduction mode (i.e. high-pass filtering), as shown in FIG. 1A. In another embodiment, the high-pass filter adjustment interface (113) may instead incorporate a sweepable (i.e. continuously variable) knob, a slider, or another variable-sweep adjustment mechanism to provide a continuously-variable sweeping adjustment interface.

Continuing with the embodiment of the invention as shown in FIG. 1A, the phantom-powered singular output (109) is configured to transmit a processed and/or amplified sound source signal to an external device, such as a sound mixer, a later-stage preamplifier/amplifier, and a sound production interface, which may be operatively connected to the phantom-powered audio preamplifier. Preferably, the external device also provides a phantom power source at 48 volts or at another operating voltage, typically in DC, to the phantom-powered singular output (109) via a phantom-power cable. A key novel aspect of the phantom-powered audio preamplifier disclosed and described in various embodiments of the present invention is related to this preamplifier's unique ability to process, amplify, and transmit both microphone-originating sound source signals and musical instrument-originating sound source signals through the same phantom-powered singular output (109) terminal, without requiring two separate output terminals and without sacrificing high-fidelity characteristics (e.g. low distortion, noise, etc.) for both microphone-originating and musical instrument-originating sound source signals. The singular output (109) terminal connection for both microphone-originating and musical instrument-originating sound source signals enables the user to manage various sound source connections more conveniently with just one first-stage preamplifier box. Unlike with conventional apparatuses, with the phantom-powered audio preamplifier in accordance with an embodiment of the present invention, the user is not required to swap and/or reconnect two conventional and separate preamplifiers—one for a microphone and another for a musical instrument—to amplify various sound source signals in an audio recording or live performance environment.

Furthermore, the phantom-powered audio preamplifier's unique ability to intelligently and automatically route different sound source signals (i.e. microphone-originating vs. musical instrument-originating) to at least two distinct impedance matching circuit pathways (i.e. a low impedance matching circuit pathway for a microphone-originating sound source signal, a high impedance matching circuit pathway coupled to an integrated instrument transformer for a musical instrument-originating sound source signal) provides optimal low-distortion and low noise early-stage amplifications of various sound source signals through a single preamplifier box, unlike conventional phantom-powered preamplifiers that are specific to amplifying either the microphone signals or the musical instrument signals.

Figure 1B:
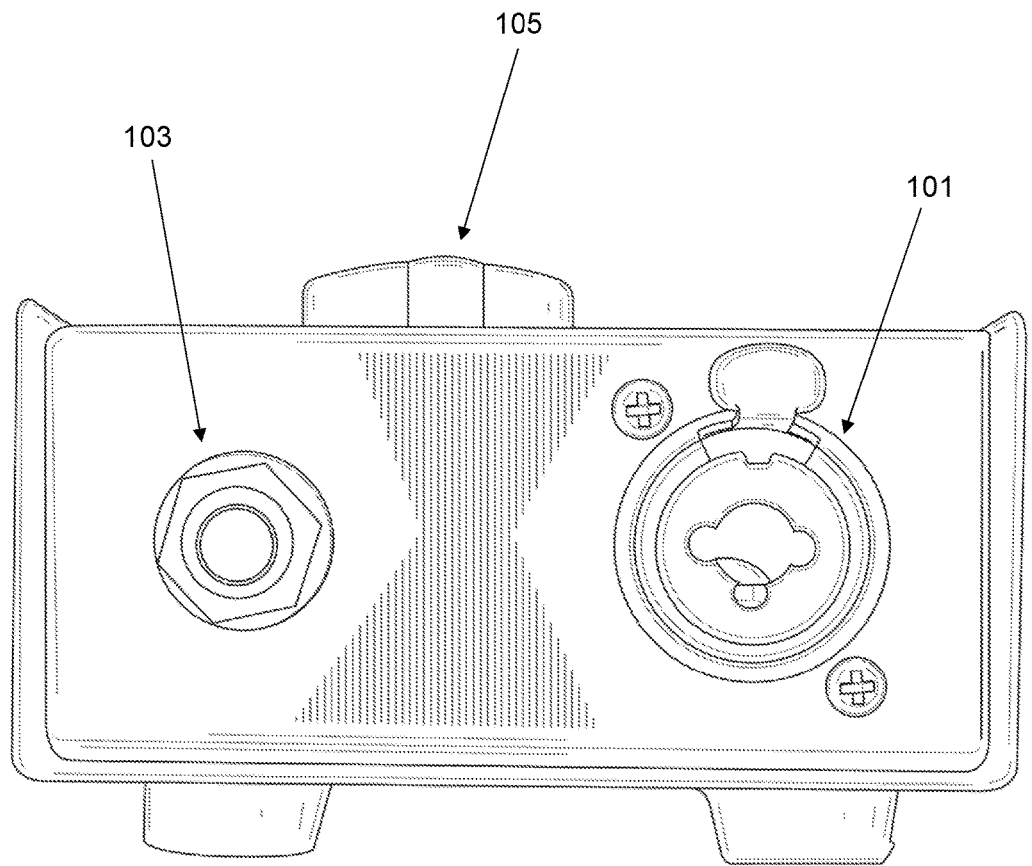
FIG. 1B shows a first side view of a phantom-powered audio preamplifier with an integrated transformer, an instrument/microphone combo input jack, and a thru-to-amp output jack, wherein the phantom-powered audio preamplifier intelligently and selectively processes musical instrument and microphone sound source signals, in accordance with an embodiment of the invention.

FIG. 1B shows a first side view (100B) of the phantom-powered audio preamplifier with the integrated transformer, the instrument/microphone combo input jack (101), the thru-to-amp output jack (103), and the variable impedance loading adjustment interface (105), wherein the phantom-powered audio preamplifier intelligently and selectively processes musical instrument and microphone sound source signals, in accordance with an embodiment of the invention. In the first side view (100B) of the phantom-powered audio preamplifier previously shown and disclosed in FIG. 1A, the instrument/microphone combo input jack (101) is configured to dock with both a low-impedance XLR microphone jack plug and a high-impedance ¼ (quarter) inch musical instrument jack plug. Furthermore, in the preferred embodiment of the invention, the thru-to-amp output jack (103) is configured to receive a standard ¼ inch musical instrument jack plug. In other embodiments of the invention, different microphone and/or musical instrument jack standards and sizes may be utilized to implement the instrument/microphone combo input jack (101) and the thru-to-amp output jack (103).

Figure 2A:
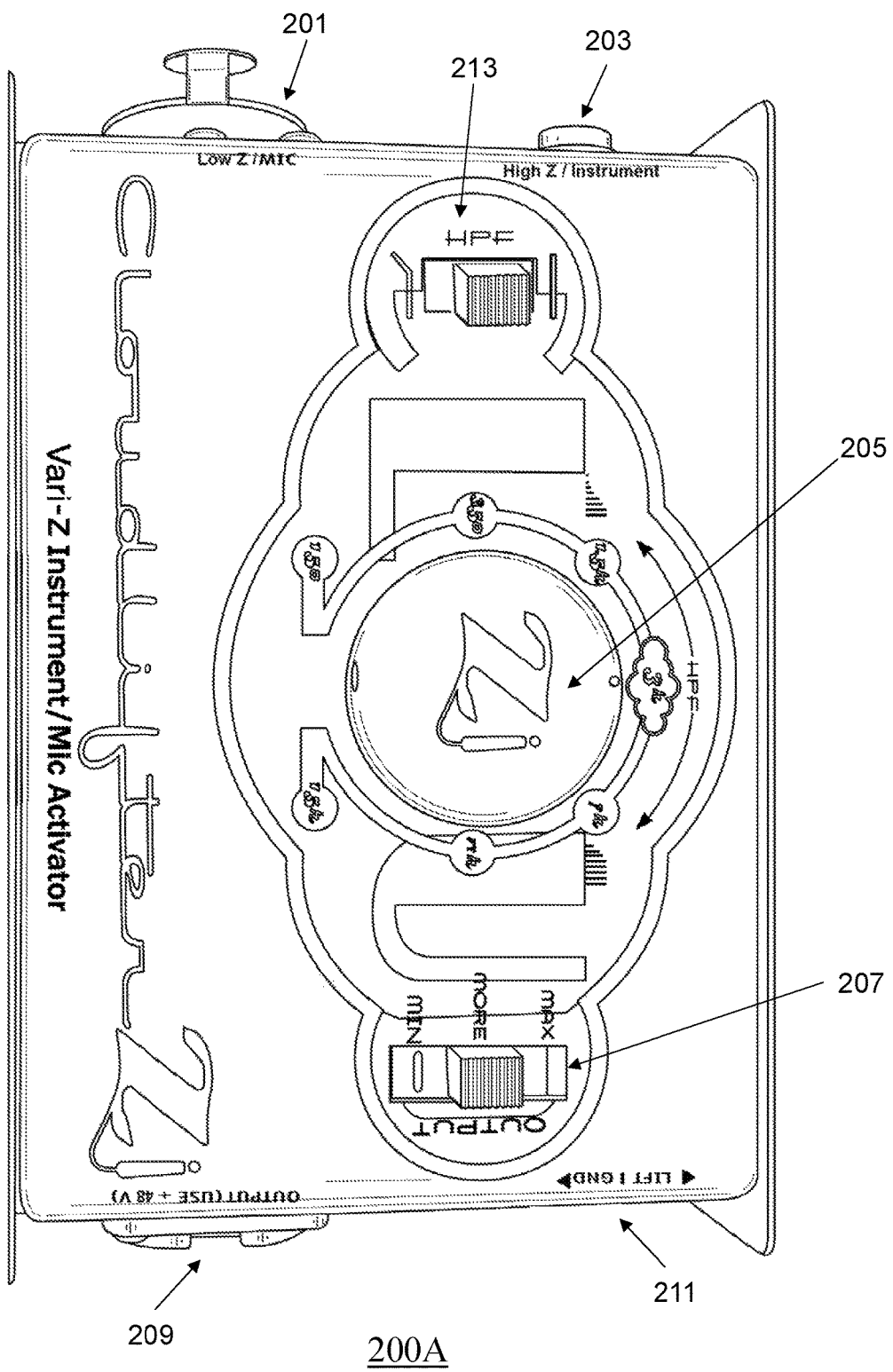
FIG. 2A shows a top view of a phantom-powered audio preamplifier with an integrated transformer, a dedicated low impedance/microphone input jack, a dedicated high impedance/instrument input jack, and a phantom-powered singular output, wherein the phantom-powered audio preamplifier intelligently and selectively processes musical instrument and microphone sound source signals, in accordance with an embodiment of the invention.

FIG. 2A shows a top view (200A) of a phantom-powered audio preamplifier with an integrated transformer for a musical instrument-sourced signal, a dedicated low impedance/microphone input jack (201), a dedicated high impedance/instrument input jack (203), and a phantom-powered singular output (209), wherein the phantom-powered audio preamplifier intelligently and selectively processes musical instrument and microphone sound source signals, in accordance with an embodiment of the invention. In this embodiment of the invention, the phantom-powered audio preamplifier also incorporates a variable impedance loading adjustment interface (205), a variable gain adjustment interface (207), a ground/lift adjustment interface (211), and a high-pass filter adjustment interface (213). The phantom-powered audio preamplifier in this embodiment of the invention can intelligently and selectively process musical instrument and microphone sound source signals in distinct signal processing pathways. In some embodiments of the invention, the distinct signal processing pathways after the initial loading of the sound source signals can still share numerous components of the phantom-powered audio preamplifier, such as the gain circuits and numerous passive components.

For example, the phantom-powered audio preamplifier receives a microphone-originating sound source signal through the dedicated low impedance/microphone input jack (201), and the phantom-powered audio preamplifier is able to determine that the incoming signal is the microphone-originating sound source signal. This signal is then routed to a low-impedance (i.e. low Z) signal pathway that provides an early-stage signal gain to the microphone-originating sound source signal. In most circumstances, the microphone-originating sound source signal is optimally matched for high-fidelity early-stage signal amplification in the low-impedance signal pathway that involves an early-stage preamplifier gains circuit, and a high-impedance signal processing pathway that involves the integrated transformer suited for musical instruments is typically bypassed.

In a preferred embodiment of the invention, the microphone-originating sound source signal is carried into the phantom-powered audio preamplifier by a standardized XLR microphone jack plug that can be docked into the dedicated low impedance/microphone input jack (201). In another embodiment of the invention, the microphone-originating sound source signal may be carried into the phantom-powered audio preamplifier by a proprietary microphone jack plug or another sound signal input jack plug.

Continuing with the embodiment of the invention as shown in FIG. 2A, the phantom-powered audio preamplifier is also configured to receive a musical instrument-originating sound source signal via the dedicated high impedance/instrument input jack (203), and the phantom-powered audio preamplifier is able to determine that the incoming signal is the musical instrument-originating sound source signal, instead of the microphone-originating sound source signal. This signal is subsequently routed to a high-impedance (i.e. high Z) signal pathway that provides an early-stage signal gain to the musical instrument-originating sound source signal. In most circumstances, the musical instrument-originating sound source signal is optimally matched for high-fidelity early-stage signal amplification in the high-impedance signal pathway that further involves coupling the integrated transformer and an early-stage preamplifier gains circuit. In one example, the output from the integrated instrument transformer is coupled to the early-stage preamplifier gains circuit and also to the variable impedance loading adjustment interface (205), which provides the musical instrument a wide range of tonal options to a musical recording or live performance environment at the earliest signal amplification stage.

In the preferred embodiment of the invention, the musical instrument-originating sound source signal is carried into the phantom-powered audio preamplifier by a standardized ¼-inch input jack plug that can be docked into the dedicated high impedance/instrument input jack (203). In another embodiment of the invention, the musical instrument-originating sound source signal may be carried into the phantom integrated instrument transformer by a proprietary musical instrument jack plug or another sound signal input jack plug. Furthermore, the integrated transformer incorporated into the phantom-powered audio preamplifier may be a Cinemag instrument transformer or another transformer device suitable for processing musical instrument-originating sound source signals.

Moreover, as shown in FIG. 2A, the variable impedance loading adjustment interface (205) on a surface of the phantom-powered audio preamplifier enables the user to select a desired impedance value among a plurality of variable impedance settings (e.g. 150 ohms, 350 ohms, 1.5 k-ohms, 3 k-ohms, 7 k-ohms, 11 k-ohms, 15 k-ohms, etc.) to achieve a customizable tone from an incoming sound source signal from a microphone or a musical instrument. In the preferred embodiment of the invention, the variable impedance loading adjustment interface (205) incorporates a plurality of defined impedance adjustment settings that can be selected by a control knob, as shown in FIG. 2A. In another embodiment, the variable impedance loading adjustment interface (205) may instead incorporate a sweepable (i.e. continuously variable) knob, a slider, or another impedance adjustment mechanism to provide a continuously-variable impedance sweeping adjustment interface.

In the preferred embodiment of the invention, setting the phantom-powered inline audio preamplifier to a low impedance loading value may emphasize mid-range audible frequency of sound over treble and/or bass, which may be desired for certain musical instruments or recording environment. For example, classical music recordings or performances, which may benefit by emphasizing mid-range audible frequency, can utilize a lower impedance loading value setting (e.g. 1.5 k ohms) for optimal sound recording or live concert production environment. The optimal value will vary depending on the output impedance of a sound signal source. In general, with a higher impedance output, the optimal value may be higher. By varying impedance loading value settings, the resulting loading effects enable a user to customize and fine-tune desirable sound characteristics through the phantom-powered inline audio preamplifier.

On the other hand, setting the phantom-powered inline audio preamplifier to a high impedance loading value may increase frequency response over a broader audible frequency ranges, thereby giving an effect of stronger bass and treble in sound recording or live concert production environment. Therefore, a rock, pop, or jazz concert or recording may benefit from adjusting the impedance loading value of the phantom-powered inline preamplifier to a high impedance loading value setting (e.g. 3,000 ohms, 5,000 ohms, or higher). For example, a microphone with a 1000-ohm output impedance may sound more natural at around 10 k-ohms. In another example, a microphone with a lower impedance like 50 or 150 ohms may sound elevated in the bass and slightly more aggressive in the top.

Impedance loading values which fall outside the range of commonly-used impedance values may produce interesting sound characteristics. For example, a very low impedance loading value may deemphasize bass and/or treble too much to produce desirable sound effects in many cases. Loading with a very low impedance may deemphasize the bass and/or treble, producing a sound with a forward midrange. However, this could be desirable in the case of an electric guitar or other source where a high amount of mid-range focus is desired. Furthermore, a very high impedance loading value may emphasize more bass and/or treble too much to make resulting sound overly bright or harsh. However, in some applications, a user may want this sound effect to produce full and crisp sound. The advantage of various embodiments of the present invention is enabling a user to set his/her own preferred impedance loading value from the phantom-powered inline audio preamplifier unit, depending on a particular sound production/recording environment, output impedance characteristics of the microphone, and a particular source of sound (e.g. vocal, piano, bass drum, violin, guitar, and etc.).

Phantom-powered inline audio preamplifiers generally utilize another preamplifier operatively connected to the phantom-powered inline audio preamplifier, wherein the other preamplifier provides phantom power (e.g. 48 V). With the phantom-powered inline preamplifier providing a first-stage signal amplification, the secondary preamplifier may only need to produce a smaller amount of additional amplification (e.g. 10-20 dB), because the inline audio preamplifier is providing some good amount of gain (e.g. 20 dB) at the earliest amplification stage. Phantom-powered inline audio preamplifiers may be highly useful in enabling the secondary preamplifier and/or other mixer interfaces to operate in their "sweetspot" gain ranges. For example, many secondary preamplifiers provide high-fidelity and optimal amplification when providing 20 dB of gain, but significantly deteriorate past 30-40 dB of gain.

In addition, the variable gain adjustment interface (207) on the surface of the phantom-powered audio preamplifier enables the user to adjust a signal output gain setting in various strengths, such as "min," "more," and "max," as shown in FIG. 2A. In a preferred embodiment of the invention, the "min" mode may add approximately 6 dB of Class A discrete gain, while the "more" mode and the "max" mode add approximately 12 dB and 25 dB of Class A discrete gain, respectively. The variable gain adjustment interface (207) enables the phantom-powered audio preamplifier as disclosed in various embodiments of the present invention to accommodate a wide variety of sound signal sources ranging from low signal output sources, such as acoustic and piezo pickups, to higher signal output sources, such as humbucking pickups or keyboards, for the first-stage preamplification.

In the preferred embodiment of the invention, the variable gain adjustment interface (207) incorporates a plurality of defined impedance adjustment settings that can be selected by a multi-position switch, as shown in FIG. 2A. In another embodiment, the variable gain adjustment interface (207) may instead incorporate a sweepable (i.e. continuously variable) knob, a slider, or another variable gain adjustment mechanism to provide a continuously-variable sweeping adjustment interface.

Furthermore, the high-pass filter adjustment interface (213) on the surface of the phantom-powered audio preamplifier enables the user to adjust the impedance load further to reduce bass frequency range (e.g. 40 Hz~200 Hz) if the user desires bass frequency range reduction for the first-stage preamplification of an incoming sound source signal. In one example, the reduction of bass may be approximately 6 dB per octave when the high-pass filter mode is active. In the preferred embodiment of the invention, the high-pass filter adjustment interface (213) incorporates a plurality of defined high-pass filter adjustment settings that can be selected by a multi-position switch for a full-frequency mode (i.e. no high-pass filtering) or a bass frequency reduction mode (i.e. high-pass filtering), as shown in FIG. 2A. In another embodiment, the high-pass filter adjustment interface (213) may instead incorporate a sweepable (i.e. continuously variable) knob, a slider, or another variable-sweep adjustment mechanism to provide a continuously-variable sweeping adjustment interface.

Continuing with the embodiment of the invention as shown in FIG. 2A, the phantom-powered singular output (209) is configured to transmit a processed and/or amplified sound source signal to an external device, such as a sound mixer, a later-stage preamplifier/amplifier, and a sound production interface, which may be operatively connected to the phantom-powered audio preamplifier. Preferably, the external device also provides a phantom power source at 48 volts or at another operating voltage, typically in DC, to the phantom-powered singular output (209) via a phantom-power cable. A key novel aspect of the phantom-powered audio preamplifier disclosed and described in various embodiments of the present invention is related to this preamplifier's unique ability to process, amplify, and transmit both microphone-originating sound source signals and musical instrument-originating sound source signals through the same phantom-powered singular output (209) terminal, without requiring two separate output terminals and without sacrificing high-fidelity characteristics (e.g. low distortion, noise, etc.) for both microphone-originating and musical instrument-originating sound source signals. The singular output (209) terminal connection for both microphone-originating and musical instrument-originating sound source signals enables the user to manage various sound source connections more conveniently with just one first-stage preamplifier box. Unlike with conventional apparatuses, with the phantom-powered audio preamplifier in accordance with an embodiment of the present invention, the user is not required to swap and/or reconnect two conventional and separate preamplifiers—one for a microphone and another for a musical instrument—to amplify various sound source signals in an audio recording or live performance environment.

Furthermore, the phantom-powered audio preamplifier's unique ability to intelligently and automatically route different sound source signals (i.e. microphone-originating vs. musical instrument-originating) to at least two distinct impedance matching circuit pathways (i.e. a low impedance matching circuit pathway for a microphone-originating sound source signal, a high impedance matching circuit pathway coupled to an integrated instrument transformer for a musical instrument-originating sound source signal) provides optimal low-distortion and low noise early-stage amplifications of various sound source signals through a single preamplifier box, unlike conventional phantom-powered preamplifiers that are specific to amplifying either the microphone signals or the musical instrument signals.

Figure 2B:
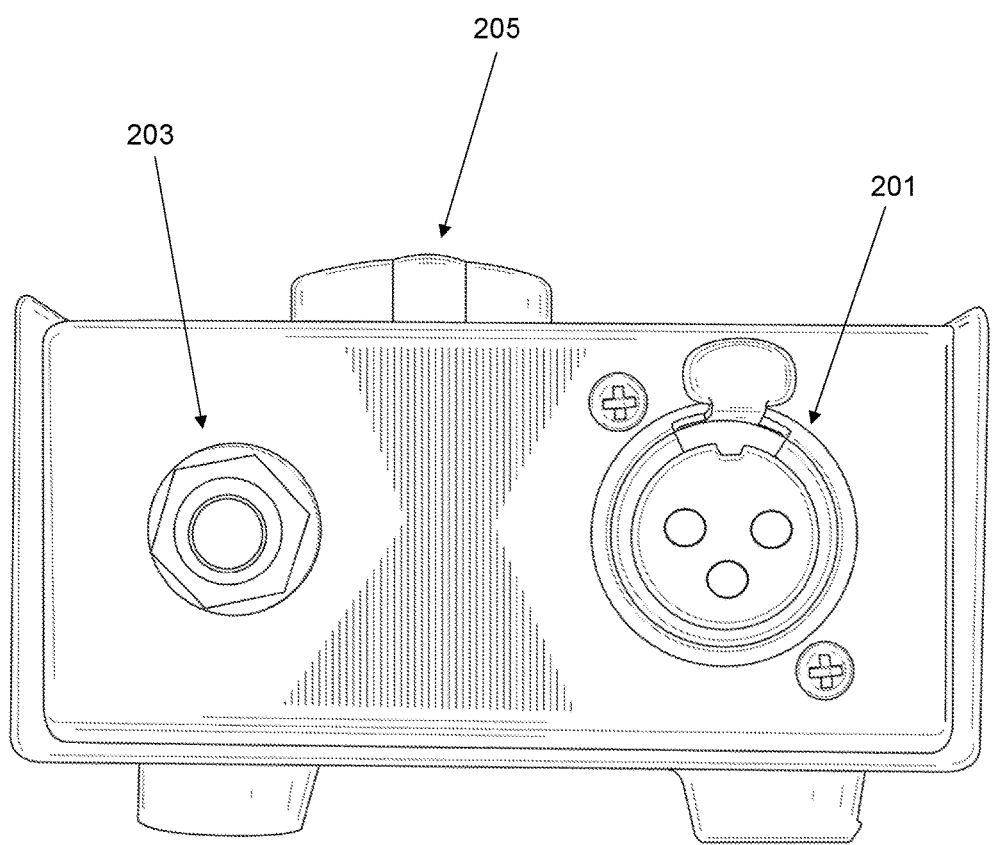
FIG. 2B shows a first side view of a phantom-powered audio preamplifier with an integrated transformer, a dedicated low impedance/microphone input jack, and a dedicated high impedance/instrument input jack, wherein the phantom-powered audio preamplifier intelligently and selectively processes musical instrument and microphone sound source signals, in accordance with an embodiment of the invention.

FIG. 2B shows a first side view (200B) of the phantom-powered audio preamplifier with the integrated transformer, the dedicated low impedance/microphone input jack (201), the dedicated high impedance/instrument input jack (203), and the variable impedance loading adjustment interface (205), wherein the phantom-powered audio preamplifier intelligently and selectively processes musical instrument and microphone sound source signals, in accordance with an embodiment of the invention. In the first side view (200B) of the phantom-powered audio preamplifier previously shown and disclosed in FIG. 2A, the dedicated low impedance/microphone input jack (201) is configured to dock with a low-impedance XLR microphone jack plug, and the dedicated high impedance/instrument input jack (203) is configured to dock with a high-impedance ¼ (quarter) inch musical instrument jack plug. In other embodiments of the invention, different microphone and/or musical instrument jack standards and sizes may be utilized to implement the dedicated low impedance/microphone input jack (201) and the dedicated high impedance/instrument input jack (203).

Figure 3A:
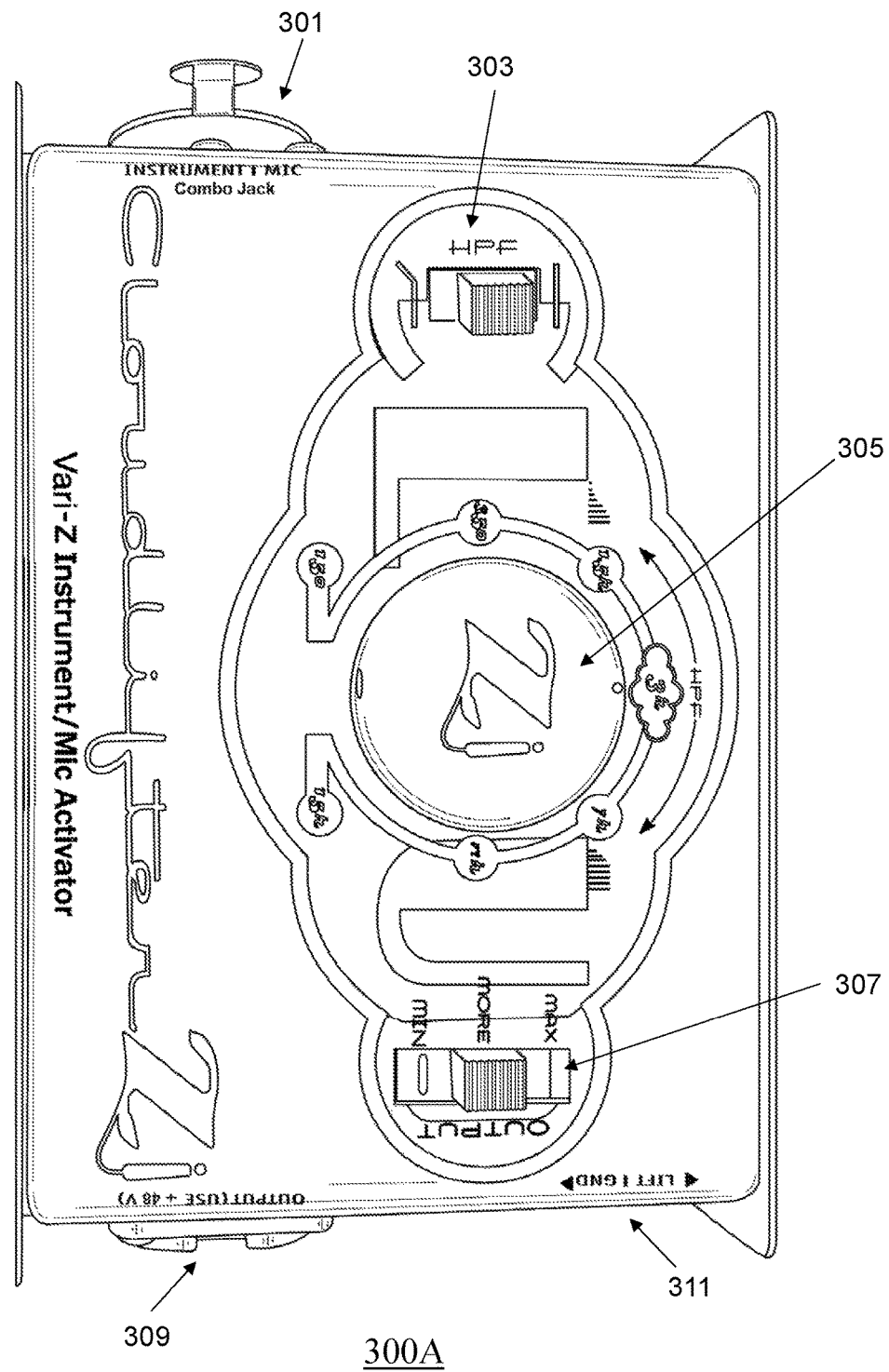
FIG. 3A shows a top view of a phantom-powered audio preamplifier with an integrated transformer, an instrument/microphone combo input jack, and a phantom-powered singular output, wherein the phantom-powered audio preamplifier intelligently and selectively processes musical instrument and microphone sound source signals, in accordance with an embodiment of the invention.

FIG. 3A shows a top view (300A) of a phantom-powered audio preamplifier with an integrated transformer, an instrument/microphone combo input jack (301), and a phantom-powered singular output (309), wherein the phantom-powered audio preamplifier intelligently and selectively processes musical instrument and microphone sound source signals, in accordance with an embodiment of the invention. In this embodiment of the invention, the phantom-powered audio preamplifier also incorporates a variable impedance loading adjustment interface (305), a variable gain adjustment interface (307), a ground/lift adjustment interface (311), and a high-pass filter adjustment interface (303). The phantom-powered audio preamplifier in this embodiment of the invention can intelligently and selectively process musical instrument and microphone sound source signals in distinct signal processing pathways.

For example, the phantom-powered audio preamplifier receives a microphone-originating sound source signal through the instrument/microphone combo input jack (301), and the phantom-powered audio preamplifier is able to determine that the incoming signal is the microphone-originating sound source signal. This signal is then routed to a low-impedance (i.e. low Z) signal pathway that provides an early-stage signal gain to the microphone-originating sound source signal. In most circumstances, the microphone-originating sound source signal is optimally matched for high-fidelity early-stage signal amplification in the low-impedance signal pathway that involves an early-stage preamplifier gains circuit, and a high-impedance signal processing pathway that involves the integrated transformer suited for musical instruments is typically bypassed.

In a preferred embodiment of the invention, the microphone-originating sound source signal is carried into the phantom-powered audio preamplifier by a standardized XLR microphone jack plug that can be docked into the instrument/microphone combo input jack (301). In another embodiment of the invention, the microphone-originating sound source signal may be carried into the phantom-powered audio preamplifier by a proprietary microphone jack plug or another sound signal input jack plug.

Continuing with the embodiment of the invention as shown in FIG. 3A, the phantom-powered audio preamplifier is also configured to receive a musical instrument-originating sound source signal via the instrument/microphone combo input jack (301), and the phantom-powered audio preamplifier is able to determine that the incoming signal is the musical instrument-originating sound source signal, instead of the microphone-originating sound source signal. This signal is subsequently routed to a high-impedance (i.e. high Z) signal pathway that provides an early-stage signal gain to the musical instrument-originating sound source signal. In most circumstances, the musical instrument-originating sound source signal is optimally matched for high-fidelity early-stage signal amplification in the high-impedance signal pathway that further involves coupling the integrated transformer and an early-stage preamplifier gains circuit. In one example, the output from the integrated transformer is coupled to the early-stage preamplifier gains circuit and also to the variable impedance loading adjustment interface (305), which provides the musical instrument a wide range of tonal options to a musical recording or live performance environment at the earliest signal amplification stage.

In the preferred embodiment of the invention, the musical instrument-originating sound source signal is carried into the phantom-powered audio preamplifier by a standardized ¼-inch input jack plug that can be docked into the instrument/microphone combo input jack (301). In another embodiment of the invention, the musical instrument-originating sound source signal may be carried into the phantom integrated transformer by a proprietary musical instrument jack plug or another sound signal input jack plug. Furthermore, the integrated transformer incorporated into the phantom-powered audio preamplifier may be a Cinemag instrument transformer or another transformer device suitable for processing musical instrument-originating sound source signals.

Moreover, as shown in FIG. 3A, the variable impedance loading adjustment interface (305) on a surface of the phantom-powered audio preamplifier enables the user to select a desired impedance value among a plurality of variable impedance settings (e.g. 150 ohms, 350 ohms, 1.5 k-ohms, 3 k-ohms, 7 k-ohms, 11 k-ohms, 15 k-ohms, etc.) to achieve a customizable tone from an incoming sound source signal from a microphone or a musical instrument. In the preferred embodiment of the invention, the variable impedance loading adjustment interface (305) incorporates a plurality of defined impedance adjustment settings that can be selected by a control knob, as shown in FIG. 3A. In another embodiment, the variable impedance loading adjustment interface (305) may instead incorporate a sweepable (i.e. continuously variable) knob, a slider, or another impedance adjustment mechanism to provide a continuously-variable impedance sweeping adjustment interface.

In the preferred embodiment of the invention, setting the phantom-powered inline audio preamplifier to a low impedance loading value may emphasize mid-range audible frequency of sound over treble and/or bass, which may be desired for certain musical instruments or recording environment. For example, classical music recordings or performances, which may benefit by emphasizing mid-range audible frequency, can utilize a lower impedance loading value setting (e.g. 1.5 k ohms) for optimal sound recording or live concert production environment. The optimal value will vary depending on the output impedance of a sound signal source. In general, with a higher impedance output, the optimal value may be higher. By varying impedance loading value settings, the resulting loading effects enable a user to customize and fine-tune desirable sound characteristics through the phantom-powered inline audio preamplifier.

On the other hand, setting the phantom-powered inline audio preamplifier to a high impedance loading value may increase frequency response over a broader audible frequency ranges, thereby giving an effect of stronger bass and treble in sound recording or live concert production environment. Therefore, a rock, pop, or jazz concert or recording may benefit from adjusting the impedance loading value of the phantom-powered inline preamplifier to a high impedance loading value setting (e.g. 3,000 ohms, 5,000 ohms, or higher). For example, a microphone with a 1000-ohm output impedance may sound more natural at around 10 k-ohms. In another example, a microphone with a lower impedance like 50 or 150 ohms may sound elevated in the bass and slightly more aggressive in the top.

Impedance loading values which fall outside the range of commonly-used impedance values may produce interesting sound characteristics. For example, a very low impedance loading value may deemphasize bass and/or treble too much to produce desirable sound effects in many cases. Loading with a very low impedance may deemphasize the bass and/or treble, producing a sound with a forward midrange. However, this could be desirable in the case of an electric guitar or other source where a high amount of mid-range focus is desired. Furthermore, a very high impedance loading value may emphasize more bass and/or treble too much to make resulting sound overly bright or harsh. However, in some applications, a user may want this sound effect to produce full and crisp sound. The advantage of various embodiments of the present invention is enabling a user to set his/her own preferred impedance loading value from the phantom-powered inline audio preamplifier unit, depending on a particular sound production/recording environment, output impedance characteristics of the microphone, and a particular source of sound (e.g. vocal, piano, bass drum, violin, guitar, and etc.).

Phantom-powered inline audio preamplifiers generally utilize another preamplifier operatively connected to the phantom-powered inline audio preamplifier, wherein the other preamplifier provides phantom power (e.g. 48 V). With the phantom-powered inline preamplifier providing a first-stage signal amplification, the secondary preamplifier may only need to produce a smaller amount of additional amplification (e.g. 10-20 dB), because the inline audio preamplifier is providing some good amount of gain (e.g. 20 dB) at the earliest amplification stage. Phantom-powered inline audio preamplifiers may be highly useful in enabling the secondary preamplifier and/or other mixer interfaces to operate in their "sweetspot" gain ranges. For example, many secondary preamplifiers provide high-fidelity and optimal amplification when providing 20 dB of gain, but significantly deteriorate past 30-40 dB of gain.

In addition, the variable gain adjustment interface (307) on the surface of the phantom-powered audio preamplifier enables the user to adjust a signal output gain setting in various strengths, such as "min," "more," and "max," as shown in FIG. 3A. In a preferred embodiment of the invention, the "min" mode may add approximately 6 dB of Class A discrete gain, while the "more" mode and the "max" mode add approximately 12 dB and 25 dB of Class A discrete gain, respectively. The variable gain adjustment interface (307) enables the phantom-powered audio preamplifier as disclosed in various embodiments of the present invention to accommodate a wide variety of sound signal sources ranging from low signal output sources, such as acoustic and piezo pickups, to higher signal output sources, such as humbucking pickups or keyboards, for the first-stage preamplification.

In the preferred embodiment of the invention, the variable gain adjustment interface (307) incorporates a plurality of defined impedance adjustment settings that can be selected by a multi-position switch, as shown in FIG. 3A. In another embodiment, the variable gain adjustment interface (307) may instead incorporate a sweepable (i.e. continuously variable) knob, a slider, or another variable gain adjustment mechanism to provide a continuously-variable sweeping adjustment interface.

Furthermore, the high-pass filter adjustment interface (303) on the surface of the phantom-powered audio preamplifier enables the user to adjust the impedance load further to reduce bass frequency range (e.g. 40 Hz~200 Hz) if the user desires bass frequency range reduction for the first-stage preamplification of an incoming sound source signal. In one example, the reduction of bass may be approximately 6 dB per octave when the high-pass filter mode is active. In the preferred embodiment of the invention, the high-pass filter adjustment interface (303) incorporates a plurality of defined high-pass filter adjustment settings that can be selected by a multi-position switch for a full-frequency mode (i.e. no high-pass filtering) or a bass frequency reduction mode (i.e. high-pass filtering), as shown in FIG. 3A. In another embodiment, the high-pass filter adjustment interface (303) may instead incorporate a sweepable (i.e. continuously variable) knob, a slider, or another variable-sweep adjustment mechanism to provide a continuously-variable sweeping adjustment interface.

Continuing with the embodiment of the invention as shown in FIG. 3A, the phantom-powered singular output (309) is configured to transmit a processed and/or amplified sound source signal to an external device, such as a sound mixer, a later-stage preamplifier/amplifier, and a sound production interface, which may be operatively connected to the phantom-powered audio preamplifier. Preferably, the external device also provides a phantom power source at 48 volts or at another operating voltage, typically in DC, to the phantom-powered singular output (309) via a phantom-power cable. A key novel aspect of the phantom-powered audio preamplifier disclosed and described in various embodiments of the present invention is related to this preamplifier's unique ability to process, amplify, and transmit both microphone-originating sound source signals and musical instrument-originating sound source signals through the same phantom-powered singular output (309) terminal, without requiring two separate output terminals and without sacrificing high-fidelity characteristics (e.g. low distortion, noise, etc.) for both microphone-originating and musical instrument-originating sound source signals. The singular output (309) terminal connection for both microphone-originating and musical instrument-originating sound source signals enables the user to manage various sound source connections more conveniently with just one first-stage preamplifier box. Unlike with conventional apparatuses, with the phantom-powered audio preamplifier in accordance with an embodiment of the present invention, the user is not required to swap and/or reconnect two conventional and separate preamplifiers—one for a microphone and another for a musical instrument—to amplify various sound source signals in an audio recording or live performance environment.

Furthermore, the phantom-powered audio preamplifier's unique ability to intelligently and automatically route different sound source signals (i.e. microphone-originating vs. musical instrument-originating) to at least two distinct impedance matching circuit pathways (i.e. a low impedance matching circuit pathway for a microphone-originating sound source signal, a high impedance matching circuit pathway coupled to an integrated instrument transformer for a musical instrument-originating sound source signal) provides optimal low-distortion and low noise early-stage amplifications of various sound source signals through a single preamplifier box, unlike conventional phantom-powered preamplifiers that are specific to amplifying either the microphone signals or the musical instrument signals.

Figure 3B:
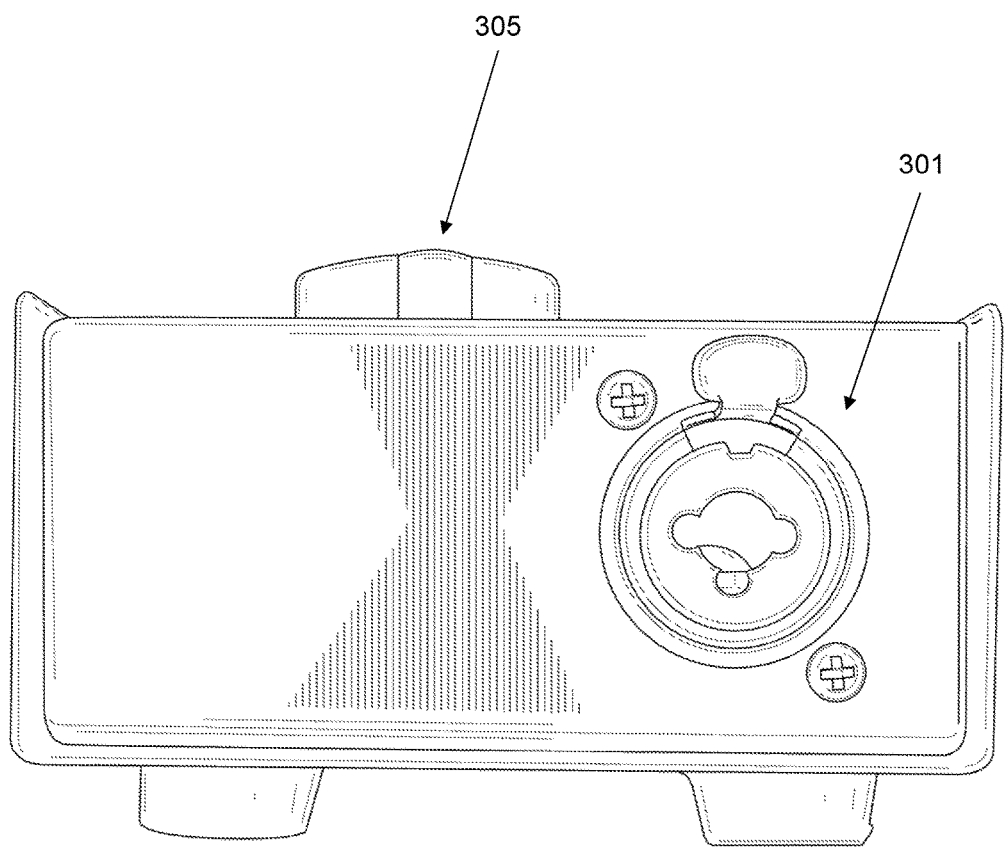
FIG. 3B shows a first side view of a phantom-powered audio preamplifier with an integrated transformer and an instrument/microphone combo input jack, wherein the phantom-powered audio preamplifier intelligently and selectively processes musical instrument and microphone sound source signals, in accordance with an embodiment of the invention.

FIG. 3B shows a first side view (300B) of the phantom-powered audio preamplifier with the integrated transformer, the instrument/microphone combo input jack (301), and the variable impedance loading adjustment interface (305), wherein the phantom-powered audio preamplifier intelligently and selectively processes musical instrument and microphone sound source signals, in accordance with an embodiment of the invention. In the first side view (300B) of the phantom-powered audio preamplifier previously shown and disclosed in FIG. 3A, the instrument/microphone combo input jack (301) is configured to dock with both a low-impedance XLR microphone jack plug and a high-impedance 1/4 (quarter) inch musical instrument jack plug. In other embodiments of the invention, different microphone and/or musical instrument jack standards and sizes may be utilized to implement the instrument/microphone combo input jack (301).

Figure 4:
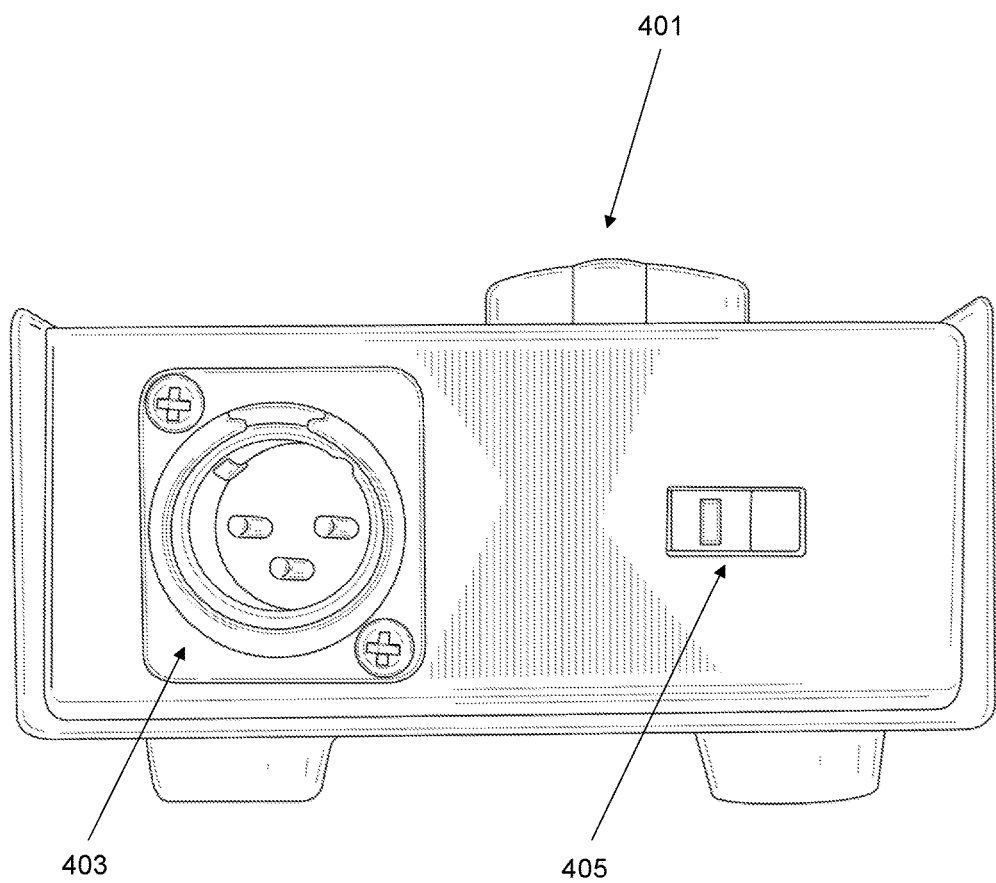
FIG. 4 shows a second side view of a phantom-powered audio preamplifier with an integrated transformer and a phantom-powered singular output, wherein the phantom-powered audio preamplifier intelligently and selectively processes musical instrument and microphone sound source signals, in accordance with an embodiment of the invention.

FIG. 4 shows a second side view (400) of a phantom-powered audio preamplifier with an integrated transformer, a ground/lift adjustment interface (405), and a phantom-powered singular output (403), wherein the phantom-powered audio preamplifier intelligently and selectively processes musical instrument and microphone sound source signals, in accordance with an embodiment of the invention. The phantom-powered audio preamplifier as depicted in FIG. 4 may be the second side view (400) of three embodiments of the invention that have been previously described in FIGS. 1A, 1B, 2A, 2B, 3A, and 3B. While the first side view (i.e. FIGS. 1B, 2B, 3B) may be distinct among the three embodiments of the invention, the second side view that shows the ground/lift adjustment interface (405) and the phantom-powered singular output (403) may be similar or identical at least in some embodiments of the invention.

As described previously in conjunction with FIGS. 1A, 1B, 2A, 2B, 3A, the phantom-powered singular output (403) is configured to transmit a processed and/or amplified sound source signal to an external device, such as a sound mixer, a later-stage preamplifier/amplifier, and a sound production interface, which may be operatively connected to the phantom-powered audio preamplifier. Preferably, the external device also provides a phantom power source at 48 volts or at another operating voltage, typically in DC, to the phantom-powered singular output (109) via a phantom-power cable. Furthermore, the ground/lift adjustment interface (405) allows the user to select a ground-connection mode or a lift (i.e. ungrounded) mode, which enables a user to ground or unground a circuitry of the phantom-powered audio preamplifier from a physical exterior enclosure of the phantom-powered audio preamplifier, depending on particular needs of an audio recording or live performance environment.

Figure 5:
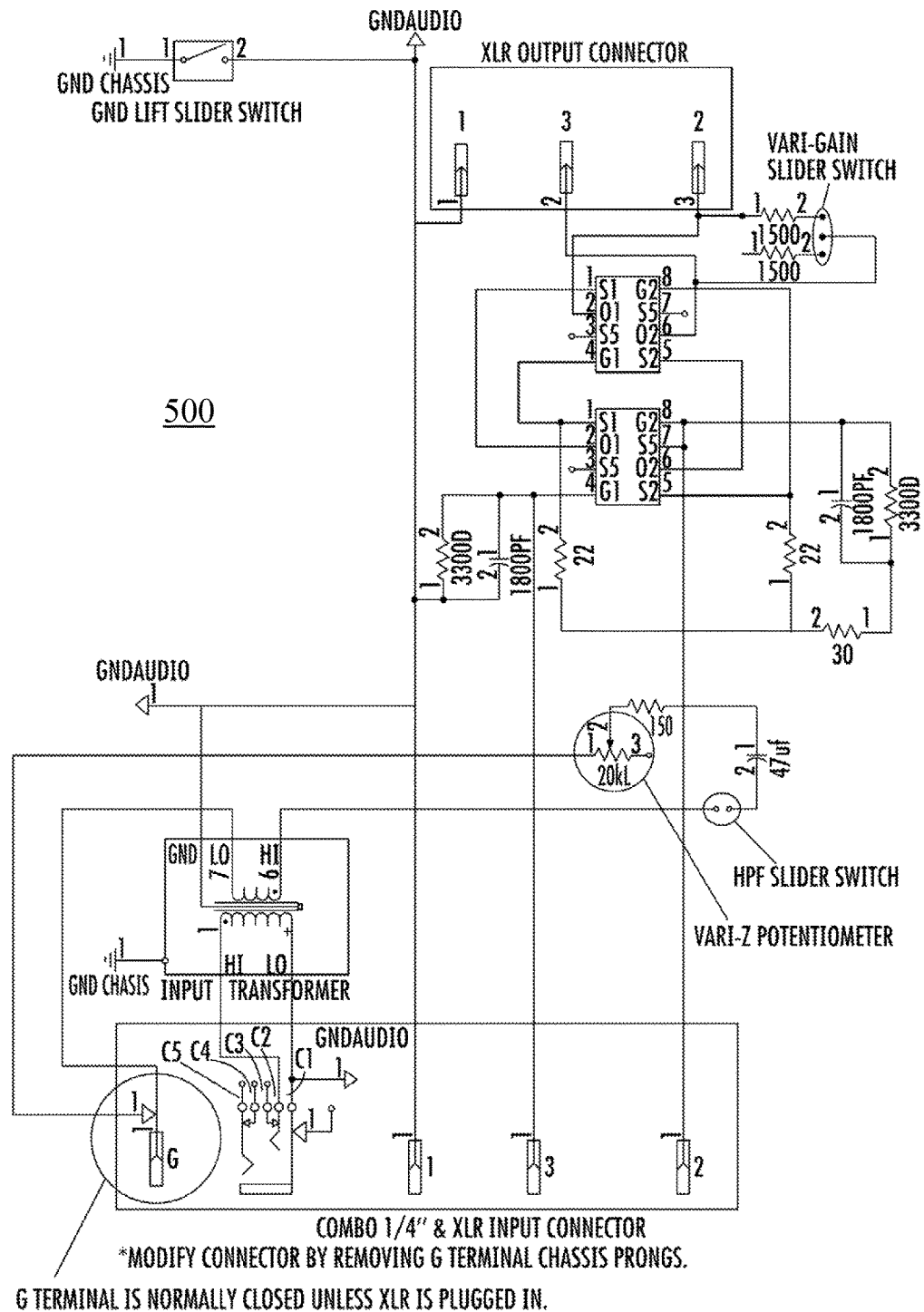
FIG. 5 shows an example of a circuit schematic that implements a phantom-powered audio preamplifier with an integrated transformer, a variable impedance loading adjustment interface, a high-pass filter adjustment interface, a variable-gain adjustment interface, one or more instrument/microphone input jacks, and a phantom-powered singular output, wherein the phantom-powered audio preamplifier intelligently and selectively processes musical instrument and microphone sound source signals, in accordance with an embodiment of the invention.

FIG. 5 shows an example of a circuit schematic (500) that implements a phantom-powered audio preamplifier with an integrated transformer, a variable impedance loading adjustment interface, a high-pass filter adjustment interface, a variable-gain adjustment interface, one or more instrument/microphone input jacks, and a phantom-powered singular output, wherein the phantom-powered audio preamplifier intelligently and selectively processes musical instrument and microphone sound source signals, in accordance with an embodiment of the invention.

As shown by the circuit schematic (500) in FIG. 5, the phantom-powered audio preamplifier incorporates a circuit logic to activate the input transformer by keeping the "G Terminal" closed if the incoming sound source signal is determined to be originating from a musical instrument. On the other hand, if an XLR microphone connection is detected instead of the musical instrument connection, then the G Terminal is transitioned to an open position, thus bypassing the input transformer designed to process the musical instrument-originating sound source signal. Furthermore, other input terminals are connected to an impedance matching circuit and/or a signal gain (i.e. amplification) circuit that are optimized to provide different impedance matching and signal processing pathways in a single phantom-powered audio preamplifier for a microphone-originating sound source signal processing and a musical instrument-originating sound source signal processing, as shown in the circuit schematic (500).

Moreover, a variable impedance potentiometer, a HPF slider switch, a ground/lift slider switch, and a variable-gain slider switch in the circuit schematic (500) in the circuit schematic (500) enable operations of a variable impedance loading adjustment interface, a high-pass filter adjustment interface, a ground/lift adjustment interface, and a variable gain adjustment interface, respectively. Furthermore, an XLR output connector, as shown in the circuit schematic (500), implements a phantom-powered singular output that transmits a processed and/or amplified signal to an external unit and also receives phantom power from the external unit, as described previously in association with other figures.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A phantom-powered audio preamplifier comprising:
   an instrument and microphone combo input jack that docks an XLR microphone jack plug to receive a microphone-originating sound source signal in one instance, and also docks a quarter-inch musical instrument jack plug in another instance to receive a musical instrument-originating sound source signal;
   a phantom-powered preamplifier gain circuit comprising one or more transistors to amplify at least one of the microphone-originating sound source signal and the musical instrument-originating sound source signal;
   an integrated musical instrument transformer coupled to the instrument and microphone combo input jack and also coupled to the phantom-powered preamplifier gain circuit to provide a high-impedance instrument signal gain and processing pathway for the musical instrument-originating sound source signal; and
   a phantom-powered singular output terminal configured to load phantom power and to simultaneously transmit an amplified signal derived from either the microphone-originating sound source signal or the musical instrument-originating sound source signal.

2. The phantom-powered audio preamplifier of claim 1, further comprising a variable impedance loading adjustable interface that enables a user to select a particular impedance loading value among a plural selection of impedance loading values available on the variable impedance loading adjustable interface, wherein the user selecting the particular impedance loading value causes a user-specified adjustment of an input impedance and an internal impedance of the phantom-powered audio preamplifier for user-desired sound characteristics achieved by varying impedance loading.

3. The phantom-powered audio preamplifier of claim 1, further comprising a high-pass filter adjustment interface to activate a full frequency mode or a bass reduction mode.

4. The phantom-powered audio preamplifier of claim 1, further comprising a variable gain adjustment interface to vary a strength level of the amplified signal that is outputted to the phantom-powered singular output terminal.

5. The phantom-powered audio preamplifier of claim 1, further comprising a thru-to-amp output jack that transmits the musical instrument-originating sound source signal without amplification or alternation to an external device.

6. The phantom-powered audio preamplifier of claim 1, further comprising a ground or lift adjustment interface that enables a user to ground or unground a circuitry of the phantom-powered audio preamplifier from a physical exterior enclosure of the phantom-powered audio preamplifier.

7. The phantom-powered audio preamplifier of claim 2, wherein the variable impedance loading adjustable interface is operatively connected to one or more resistors and a potentiometer to change a resistive input impedance of the phantom-powered audio preamplifier.

8. The phantom-powered audio preamplifier of claim 2, wherein the plural selection of impedance loading values include at least two of 150 ohms, 350 ohms, 1.5 k-ohms, 3 k-ohms, 7 k-ohms, 11 k-ohms and 15 k-ohms.

9. The phantom-powered audio preamplifier of claim 1, wherein the phantom power is supplied by a secondary preamplifier operatively connected to the phantom-powered singular output terminal, and wherein the phantom power is 48 DC Volts.

10. A phantom-powered audio preamplifier comprising:
a dedicated low impedance microphone input jack configured to receive a microphone-originating sound source signal;
a dedicated high impedance instrument input jack configured to receive a musical instrument-originating sound source signal;
a phantom-powered preamplifier gain circuit comprising one or more transistors to amplify at least one of the microphone-originating sound source signal and the musical instrument-originating sound source signal;
an integrated musical instrument transformer coupled to the dedicated high impedance instrument input jack and also coupled to the phantom-powered preamplifier gain circuit to provide a high-impedance instrument signal gain and processing pathway for the musical instrument-originating sound source signal; and
a phantom-powered singular output terminal configured to load phantom power and to simultaneously transmit an amplified signal derived from either the microphone-originating sound source signal or the musical instrument-originating sound source signal.

11. The phantom-powered audio preamplifier of claim 10, further comprising a variable impedance loading adjustable interface that enables a user to select a particular impedance loading value among a plural selection of impedance loading values available on the variable impedance loading adjustable interface, wherein the user selecting the particular impedance loading value causes a user-specified adjustment of an input impedance and an internal impedance of the phantom-powered audio preamplifier for user-desired sound characteristics achieved by varying impedance loading.

12. The phantom-powered audio preamplifier of claim 10, further comprising a high-pass filter adjustment interface to activate a full frequency mode or a bass reduction mode.

13. The phantom-powered audio preamplifier of claim 10, further comprising a variable gain adjustment interface to vary a strength level of the amplified signal that is outputted to the phantom-powered singular output terminal.

14. The phantom-powered audio preamplifier of claim 10, further comprising a ground or lift adjustment interface that enables a user to ground or unground a circuitry of the phantom-powered audio preamplifier from a physical exterior enclosure of the phantom-powered audio preamplifier.

15. The phantom-powered audio preamplifier of claim 11, wherein the variable impedance loading adjustable interface is operatively connected to one or more resistors and a potentiometer to change a resistive input impedance of the phantom-powered audio preamplifier.

16. The phantom-powered audio preamplifier of claim 11, wherein the plural selection of impedance loading values include at least two of 150 ohms, 350 ohms, 1.5 k-ohms, 3 k-ohms, 7 k-ohms, 11 k-ohms and 15 k-ohms.

17. The phantom-powered audio preamplifier of claim 10, wherein the phantom power is supplied by a secondary preamplifier operatively connected to the phantom-powered singular output terminal, and wherein the phantom power is 48 DC Volts.

18. The phantom-powered audio preamplifier of claim 10, wherein the microphone-originating sound source signal is received by the dedicated low impedance microphone input jack via an XLR microphone jack plug, and wherein the musical instrument-originating sound source signal is received by the dedicated high impedance instrument input jack via a quarter-inch musical instrument jack plug.

\* \* \* \* \*